(12) United States Patent
Jain et al.

(10) Patent No.: US 12,633,915 B1
(45) Date of Patent: May 19, 2026

(54) DYNAMIC SWITCHING ARCHITECTURE FOR HIGH VOLTAGE APPLICATIONS

(71) Applicant: Cadence Design Systems, Inc., San Jose, CA (US)

(72) Inventors: Vipul Jain, West Bengal (IN); Vinod Kumar, Uttar Pradesh (IN); Hajee Mohammed Shuaeb Fazeel, Bengaluru (IN)

(73) Assignee: Cadence Design Systems, Inc., San Jose, CA (US)

( * ) Notice: Subject to any disclaimer, the term of this patent is extended or adjusted under 35 U.S.C. 154(b) by 57 days.

(21) Appl. No.: 18/627,799

(22) Filed: Apr. 5, 2024

(51) Int. Cl.
H03K 17/687 (2006.01)

(52) U.S. Cl.
CPC ................................ H03K 17/6872 (2013.01)

(58) Field of Classification Search
CPC ....... H03K 17/6872; H03K 19/018521; H03K 19/018571
See application file for complete search history.

(56) References Cited

U.S. PATENT DOCUMENTS 9,966,955 B2 * 5/2018 Dey ............... H03K 19/017509

* cited by examiner

*Primary Examiner* — Menatoallah Youssef
*Assistant Examiner* — Colleen J O'Toole
(74) *Attorney, Agent, or Firm* — Mark H. Whittenberger; Holland & Knight LLP

(57) ABSTRACT

The present disclosure describes a dynamic switching circuit that may include an interface that may be configured to receive a variable external signal. The dynamic switching circuit may include a maximum voltage circuit that may be operatively connected to the interface. The maximum voltage circuit may include a first PMOS switch and a first NMOS switch and may provide a maximum signal configured to place the first PMOS switch into an off-state and to place the first NMOS switch into an on-state. The maximum voltage circuit may also include a minimum voltage circuit that may be operatively connected to the interface. The minimum voltage circuit may include a second PMOS switch and a second NMOS switch and may provide a minimum signal configured to place the second NMOS switch into an off-state and to place the second PMOS switch into an on-state.

19 Claims, 7 Drawing Sheets

400 ⟍

200

202

300

302

600

602

DYNAMIC SWITCHING ARCHITECTURE FOR HIGH VOLTAGE APPLICATIONS

FIELD OF THE INVENTION

Embodiments of the present disclosure relate to dynamic switching for high-voltage applications using thin oxide (core) devices.

BACKGROUND

The higher data rate requirement in the artificial intelligence (AI) era has demanded near constant evolution of technology processing nodes. The movement of transistor structure from bipolar-junction transistors (BJT) to metal-oxide field effect transistors (MOSFET) to fin-shaped field effect transistors (FinFET) preserved the validity of Moore's Law, which states that the number of transistors on an integrated circuit doubles every two years, with minimal increase in cost. More recently, new 3D transistors known as gate all around (GAA) transistors have experienced a rise in adoption. The technology shift introduces new challenges, such as the fact that use of various oxide devices is very limited in the technology and the fact that current high voltage designs require some oxide devices having much more stringent upper voltage limits.

SUMMARY

In one implementation, a dynamic switching circuit is provided having an interface that may be configured to receive a variable external signal. The dynamic switching circuit may also include a maximum voltage circuit that may be operatively connected to the interface. The maximum voltage circuit may include a first positive channel metal oxide semiconductor (PMOS) switch and a first negative channel metal oxide semiconductor (NMOS) switch. The maximum voltage circuit may provide a maximum signal that may be configured to place the first PMOS switch into an off-state when at least one condition from a first set of conditions is satisfied and to place the first NMOS switch into an on-state when at least one condition from a second set of conditions is satisfied. The dynamic switching circuit may further include a minimum voltage circuit that may be operatively connected to the interface. The minimum voltage circuit may include a second PMOS switch and a second NMOS switch. The minimum voltage circuit may provide a minimum signal that may be configured to place the second NMOS switch into an off-state when at least one condition from a third set of conditions is satisfied and to place the second PMOS switch into an on-state when at least one condition from a fourth set of conditions is satisfied.

One or more of the following features may be included. In some embodiments, the external signal, the maximum signal, and the minimum signal may be configured to vary between a first voltage level, an output drain power voltage (VDDQ), a first percentage of VDDQ, a second percentage of VDDQ, and a third percentage of VDDQ. The first set of conditions that may allow the maximum signal to place the first PMOS switch into an off-state may include: (i) the external signal may be at the first percentage of VDDQ and the maximum signal at a drain of the first PMOS switch may be at the first percentage of VDDQ, and (ii) the external signal may be at VDDQ and the maximum signal at the drain of the first PMOS switch may be at VDDQ. The second set of conditions that may allow the maximum signal to place the first NMOS switch into an on-state may include: (i) the external signal may be at the first voltage level and the maximum signal at a source of the first NMOS switch being at the first percentage of VDDQ, and (ii) the external signal may be at VDDQ, and the maximum signal at the source of the first NMOS switch may also be at VDDQ. The first PMOS switch in conjunction with the minimum voltage circuit may be configured to pass the maximum signal through the first NMOS switch when the external signal and the maximum signal at the first NMOS switch may both be at VDDQ. The third set of conditions that may allow the minimum signal to place the second NMOS switch into an off-state may include: (i) the external signal may be at the first voltage level and the minimum signal at a drain of the second NMOS switch may also be at the first voltage level, and (ii) the external signal may be at VDDQ and the minimum signal at the drain of the second NMOS switch may be at the second percentage of VDDQ. The fourth set of conditions that may allow the minimum signal to place the second PMOS switch into an on-state may include: (i) the external signal may be at the first voltage level and the minimum signal at a drain of the second PMOS switch may also be at the first voltage level, and (ii) the external signal may be at VDDQ and the minimum signal at the second PMOS switch may be at the drain of the second percentage of VDDQ. The second NMOS switch in conjunction with the maximum voltage circuit may be configured to pass a signal at the first voltage level through the drain of the second NMOS switch when the external signal and the minimum signal at the drain of the second PMOS switch may both be at the first voltage level. The dynamic switching circuit may also include an unterminated mode that may be configured to increase the maximum signal to be at VDDQ and to hold the minimum signal at or near the first voltage level, when a control signal may be transmitted at the third percentage of VDDQ. The dynamic switching circuit may include a terminated mode that may be configured to hold the maximum signal at or above VDDQ and to hold the minimum signal at or above the second percentage of VDDQ. On a rising signal edge: (i) the maximum signal may reach VDDQ more quickly than the external signal may reach VDDQ, (ii) the maximum signal may reach the first percentage of VDDQ when the external signal may be at the first voltage level, and (iii) a difference between the maximum signal (MAX) and the minimum signal (MIN) may be greater than the first percentage (%) of VDDQ, such that MAX−MIN>%*VDDQ, when the external signal may be at the third percentage of VDDQ. On a falling signal edge: (i) the minimum signal may reach the first voltage level more quickly than the external signal may reach the first voltage level, (ii) the minimum signal may reach the second percentage of VDDQ when the external signal may be at VDDQ, and (iii) a difference between the maximum signal (MAX) and the minimum signal (MIN) may be greater than the first percentage (%) of VDDQ, such that MAX−MIN>%*VDDQ, when the external signal may be at the third percentage of VDDQ. A static current passing through the maximum circuit and the minimum circuit may be at the first voltage level, such that there may be no excess power consumption.

In another embodiment of the present disclosure, a system for dynamic switching may include a dynamic switching circuit. The dynamic switching circuit may include an interface that may be configured to receive a variable external signal. The dynamic switching circuit may also include a maximum voltage circuit that may be operatively connected to the interface and may include a first PMOS switch and a first NMOS switch, where the maximum voltage circuit may provide a maximum signal that may be configured to place the first PMOS switch into an off-state when at least one condition from a first set of conditions may be satisfied and to place the first NMOS switch into an on-state when at least one condition from a second set of conditions may be satisfied. The dynamic switching circuit may further include a minimum voltage circuit that may be operatively connected to the interface and may include a second PMOS switch and a second NMOS switch, where the minimum voltage circuit may provide a minimum signal that may be configured to place the second NMOS switch into an off-state when at least one condition from a third set of conditions may be satisfied and to place the second PMOS switch into an on-state when at least one condition from a fourth set of conditions may be satisfied. The external signal, the maximum signal, and the minimum signal may be configured to vary between a first voltage level, an output drain power voltage (VDDQ), a first percentage of VDDQ, a second percentage of VDDQ, and a third percentage of VDDQ.

One or more of the following features may be included. In some embodiments, a first plurality of inverters may be operatively connected to the interface via a third PMOS switch and a second plurality of inverters may be operatively connected to the interface via a third NMOS switch. The first plurality of inverters and the second plurality of inverters may both be configured to protect external devices connected to the interface from stress that may be caused by variation in the maximum signal and the minimum signal. The maximum voltage circuit may further include a plurality of PMOS switches, in addition to the first PMOS switch, and the minimum voltage circuit may further include a plurality of NMOS switches, in addition to the second NMOS switch. On a rising signal edge: (i) the maximum signal may reach VDDQ more quickly than the external signal may reach VDDQ, (ii) the maximum signal may reach the first percentage of VDDQ when the external signal may be at the first voltage level, and (iii) a difference between the maximum signal (MAX) and the minimum signal (MIN) may be greater than the first percentage (%) of VDDQ, such that MAX−MIN>%*VDDQ, when the external signal may be at the third percentage of VDDQ. On a falling signal edge: (i) the minimum signal may reach the first voltage level more quickly than the external signal may reach the first voltage level, (ii) the minimum signal may reach the second percentage of VDDQ when the external signal may be at VDDQ, and (iii) a difference between the maximum signal (MAX) and the minimum signal (MIN) may be greater than the first percentage (%) of VDDQ, such that MAX−MIN>%*VDDQ, when the external signal may be at the third percentage of VDDQ. The dynamic switching circuit may include an unterminated mode that may be configured to increase the maximum signal to be at VDDQ and to hold the minimum signal at or near the first voltage level, when a control signal may be transmitted at the third percentage of VDDQ. The dynamic switching circuit may also include a terminated mode that may be configured to hold the maximum signal at or above VDDQ and to hold the minimum signal at or above the second percentage of VDDQ.

It is to be understood that both the foregoing general description and the following detailed description are exemplary and explanatory and are intended to provide further explanation of embodiments of the present disclosure as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
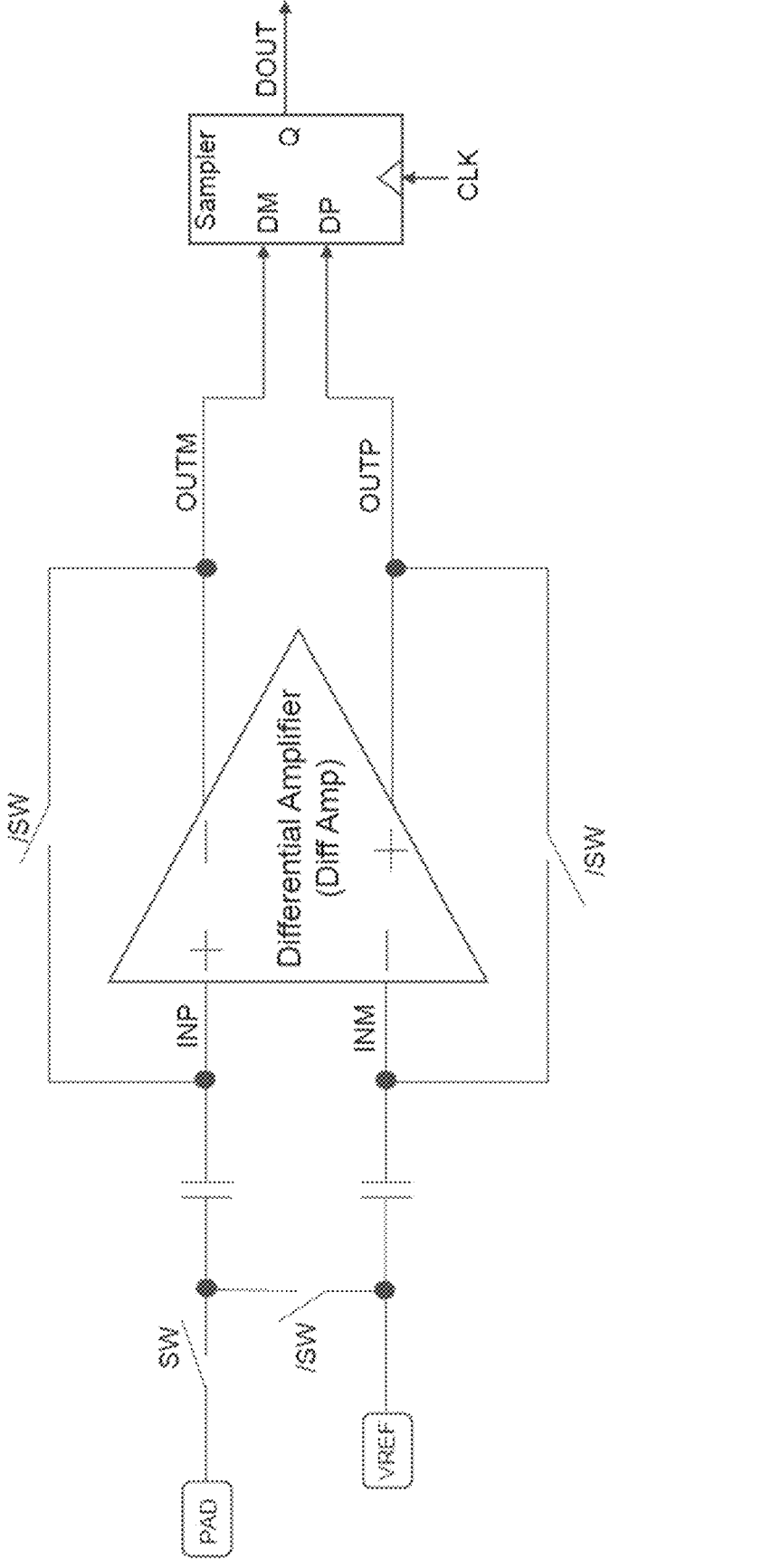
FIG. 1 is a diagram illustrating an example architecture for a dynamic switching circuit.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity. Like reference numerals in the drawings denote like elements.

A switch may be considered a core block in modern analog digitally assisted circuit design. Some designs may find great utility by including switches in high-voltage application circuits like switched capacitor amplifiers, sample and hold circuits, auto-zeroing circuits, etc. This trend may emphasize the need for a novel switch architecture that may only use thin oxide devices, that may have the ability to reliably pass high-voltage levels without issue, and that may provide flat resistance across the high voltage range and higher bandwidth while in an on-state.

In electronics, electrical termination is the practice of ending a transmission line with a device that matches the characteristic impedance of the line. As such, termination prevents signals from reflecting off the end of the transmission line. Referring to FIG. 1, an example architecture for dynamic switching circuit 100 is shown. Dynamic switching circuit 100 may include a PAD and a plurality of switches (SW) connected to a pair of capacitors. In the context of the present disclosure, a PAD may refer to a node, interface, or port on an integrated circuit chip or similar device where an internal circuit may be connected to components outside of the integrated circuit chip.

Both capacitors may be operatively connected to a differential amplifier (Diff Amp), which may transmit output signals (OUTM & OUTP) to a signal sampler. In an unterminated mode, the PAD may use full-scale high-voltage levels that standard thin oxide switches may not withstand without suffering some damage. To account for this shortcoming dynamic switching circuit 100 may use switches made of core devices that may pass and block higher voltages without stressing the devices, instead of using thin oxide materials for each of the plurality of switches (SW). Additionally, the overall impedance Ron should be flat across the full range of dynamic switching circuit 100 while in an on-state, where the PAD may be fully utilized. Moreover, the rising/falling transition of a control signal transmitted through dynamic switching circuit 100 should be smooth, and the Ron should meet the 95%-98% settling criteria normally required in both low-speed and high-speed operations.

In conventional designs, placing dynamic switching circuit 100 into an off-state while in an unterminated mode may require using the full range voltages, where the positive-metal oxide semiconductor (PMOS) may be tied to output drain power voltage (VDDQ), and the negative-metal oxide semiconductor (NMOS) may be tied to 0V. However, when the PAD signal may change from 0V to VDDQ and vice-versa the PMOS switch to source/drain may be VDDQ at PAD=0V and similarly, NMOS switch to source/drain may be VDDQ at PAD=VDDQ. In double data rate (DDR) or graphics double data rate (GDDR) applications VDDQ=1.2V and hence the maximum positive supply voltage (VDDmax) may be 1.236V. This high voltage level may stress the PAD immensely. Other levels, lower than VDDQ for PMOS and higher than 0V for NMOS may not be able to close the switch properly and as such may see some ripples in the PAD signal.

To place dynamic switching circuit 100 into an on-state while in an unterminated on mode may require using a 0.33*VDDQ voltage for PMOS and a 0.66*VDDQ voltage for NMOS. At these levels, the control signal may pass the 0V and VDDQ without any concerns but at 0.5*VDDQ there may be a dead zone where both PMOS/NMOS switches may be considered very weakly in an on-state. Hence the effective impedance of dynamic switching circuit 100 may become very high, which in turn may slow down the transition at 0.5*VDDQ level and may cause a glitch in data transmission which may corrupt data. Hence, such conventional designs may not be successfully used with higher voltage levels.

When placing dynamic switching circuit 100 into an off-state while in the unterminated mode, the plurality of switches (SW) may protect the PAD from voltage stress, and the plurality of switches (SW) may never see a voltage difference of more than 0.66*VDDQ. When dynamic switching circuit 100 may be in an on-state while in the unterminated mode, using 0.33*VDDQ for PMOS and 0.66*VDDQ for NMOS may easily allow for a control signal to pass the 0V and VDDQ levels without any concern. However, the same problem arises as mentioned before, at a 0.5*VDDQ voltage level there may be a dead zone where both the PMOS switches and the NMOS switches may be considered weakly in an on-state and hence the effective impedance of dynamic switching circuit 100 may become very high which in turn may slow down the signal transition at the 0.5*VDDQ voltage level and again corrupt data transmission.

While dynamic switching circuit 100 may be in an on-state, in the terminated mode, the data rate may be very high as required by the double data rate 5 (DDR5) and graphics double data rate 7 (GDDR7) standards. As such, the parasitics (unwanted components that arise from physical properties of the circuit) associated with the plurality of switches (SW) may be very high which may adversely affect the bandwidth and make the 95-98% settling criteria of the DDR5 and GDDR7 standards very difficult to satisfy. Hence such conventional designs may not be successfully used with slow slew rates and high frequencies.

Figure 2A:
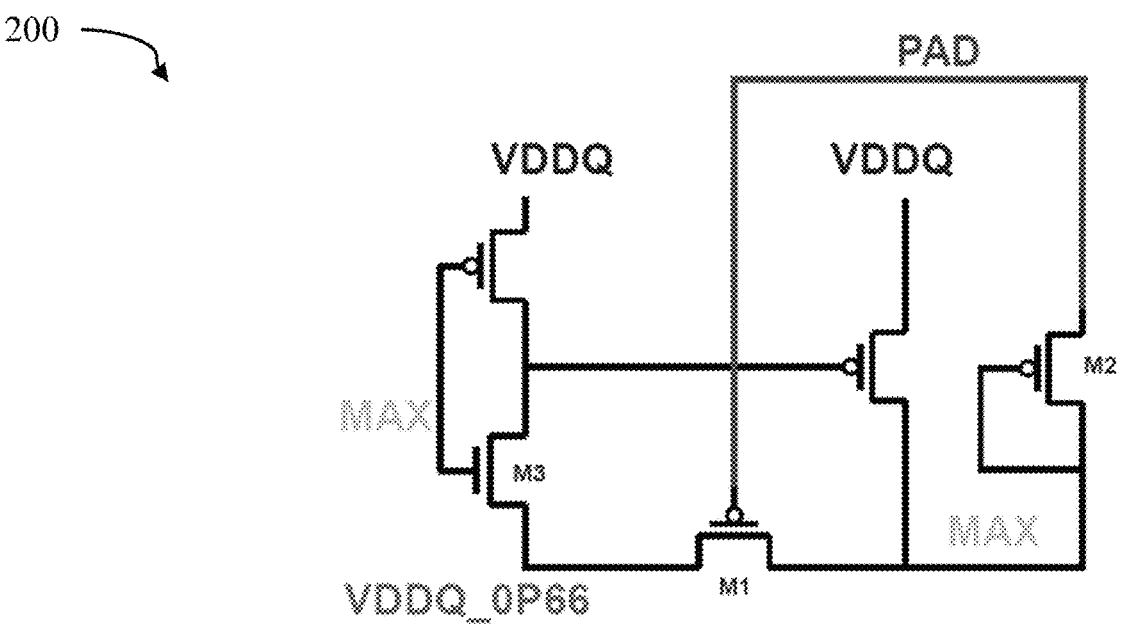
FIG. 2A is a diagram illustrating an example architecture for a maximum voltage circuit in accordance with the present disclosure.
Figure 2B:
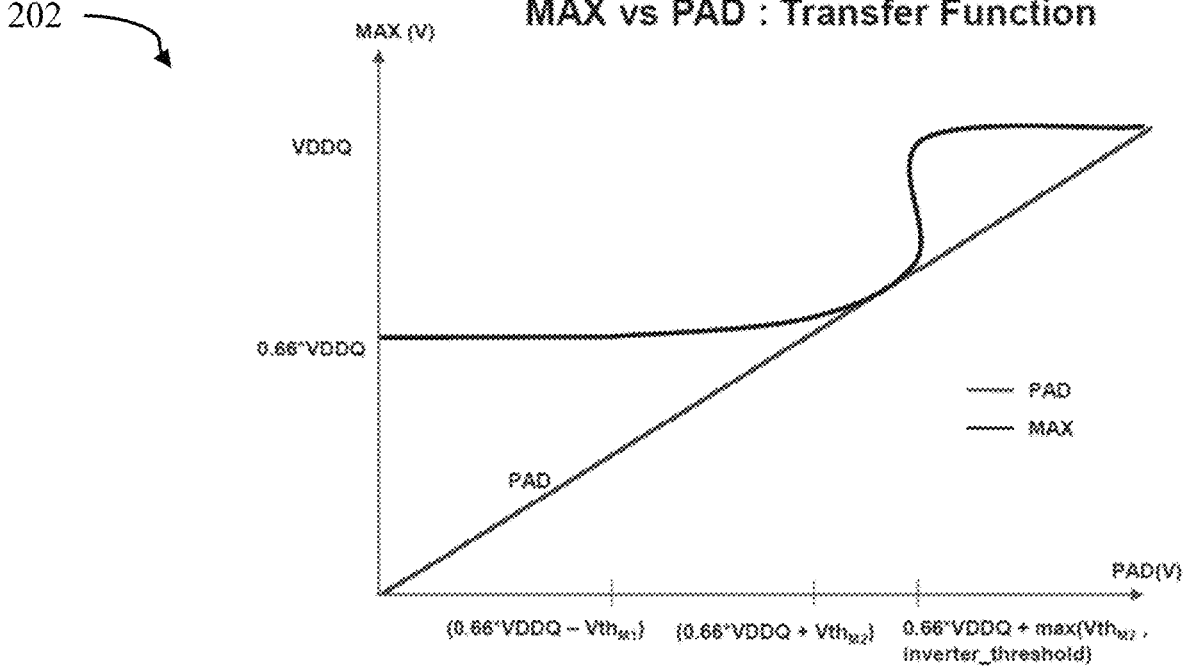
FIG. 2B is a graph illustrating example transfer characteristics associated with the architecture of FIG. 2B.

Referring now to FIGS. 2A & 2B, a diagram illustrating an example architecture for maximum voltage circuit 200, and plot 202 illustrating example transfer characteristics associated with maximum voltage circuit 200 are shown. Maximum voltage circuit 200 may be operatively connected to a PAD (not shown), which may be configured to receive a variable external signal (PAD signal). Maximum voltage circuit 200 may further include first PMOS switch (M1) and first NMOS switch (M3). Maximum voltage circuit 200 may also provide a maximum signal (MAX) that may be a function of transitions in the PAD signal, such that $$\text{MAX(pad)} = \begin{cases} VDDQ, \text{ pad} > 0.66 * VDDQ \\ 0.66 * VDDQ, \text{ pad} \le 0.66 * VDDQ \end{cases},$$

where the 0.66*VDDQ voltage level may represent the highest level of voltage tolerable for the thin oxide core devices used in the switching process. Additionally, the maximum signal may be configured to place first PMOS switch (M1) into an off-state when at least one condition from a first set of conditions may be satisfied and to place first NMOS switch (M3) into an on-state when at least one condition from a second set of conditions may be satisfied.

Figure 3A:
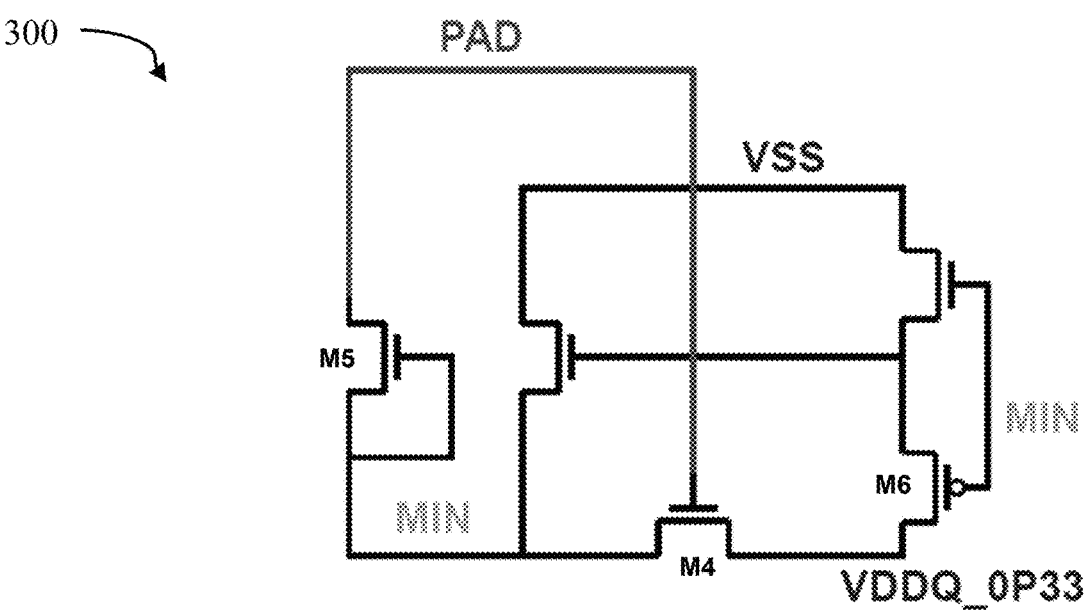
FIG. 3A is a diagram illustrating an example architecture for a minimum voltage circuit in accordance with the present disclosure.

In some embodiments, maximum voltage circuit 200 may further include a plurality of PMOS switches, in addition to the first PMOS switch, where the plurality of PMOS switches may be configured to protect the PAD from stress caused by variation in the maximum signal (MAX) and a minimum signal (MIN, see FIG. 3A).

In some embodiments, the first set of conditions that allow the maximum signal to place first PMOS switch (M1) into an off-state may include: (i) the PAD signal being at a first percentage of VDDQ (0.66*VDDQ) and the maximum signal at a drain of the first PMOS switch (M1) being at (0.66*VDDQ), and (ii) the PAD signal being at VDDQ and the maximum signal at the drain of the first PMOS switch (M1) also being at VDDQ.

In some embodiments, the second set of conditions that allow the maximum signal to place first NMOS switch (M3) into an on-state may include: (i) the PAD signal being at a first voltage level (0V) and the maximum signal at a source of the first NMOS switch (M3) being at 0.66*VDDQ, and (ii) the PAD signal being at VDDQ, and the maximum signal at the source of the first NMOS switch (M3) also being at VDDQ.

In some embodiments, first PMOS switch (M1) in conjunction with a minimum voltage circuit (see FIG. 3A) may be configured to pass the maximum signal through first NMOS switch (M3) when the PAD signal and the maximum signal at the source of the first NMOS switch (M3) are both at VDDQ.

Figure 3B:
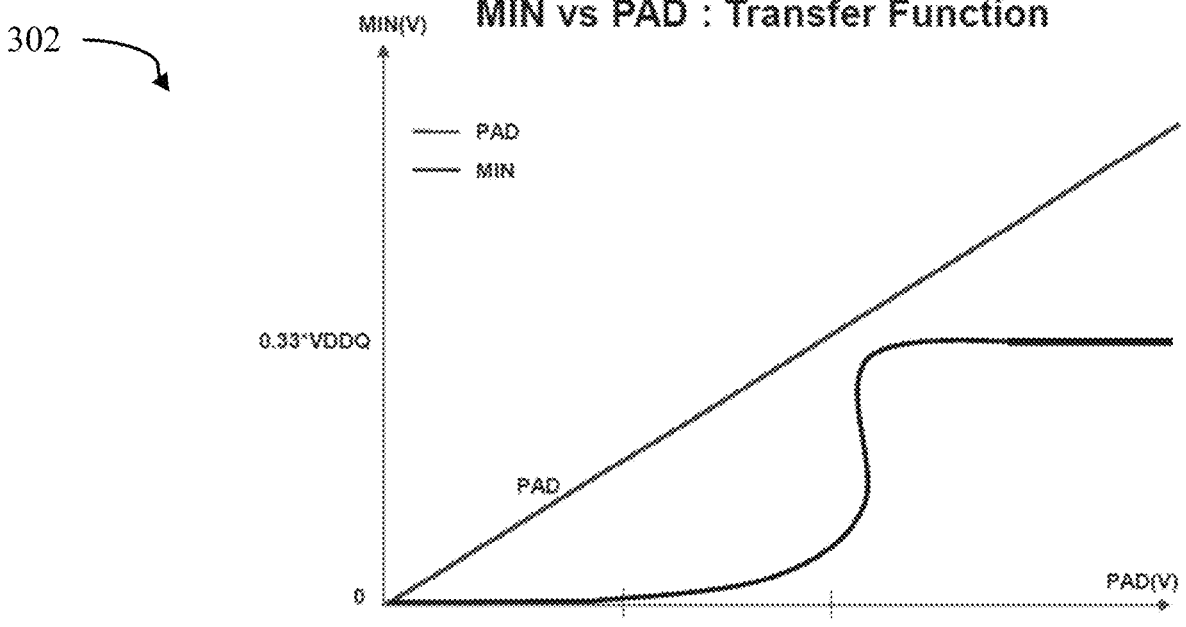
FIG. 3B is a graph illustrating example transfer characteristics associated with the architecture of FIG. 3B.

Referring now to FIGS. 3A & 3B, a diagram illustrating an example architecture for minimum voltage circuit 300, and plot 302 illustrating example transfer characteristics associated with minimum voltage circuit 300 are shown. Minimum voltage circuit 300 may be operatively connected to a PAD (not shown), which may be configured to receive a variable external signal (PAD signal). Minimum voltage circuit 300 may further include second PMOS switch (M6) and second NMOS switch (M4). Minimum voltage circuit 300 may also provide a minimum signal (MIN) that may be a function of transitions in the PAD signal, such that $$\text{MIN(pad)} = \begin{cases} 0.33 * VDDQ, \text{ pad} > 0.33 * VDDQ \\ 0, \text{ pad} \le 0.33 * VDDQ \end{cases},$$

where the 0.33*VDDQ voltage level may represent the highest level of voltage tolerable for the thin oxide core devices used in a given process. Additionally, the minimum signal may be configured to place second NMOS switch (M4) into an off-state when at least one condition from a third set of conditions may be satisfied and to place second PMOS switch (M6) into an on-state when at least one condition from a fourth set of conditions may be satisfied.

In some embodiments, minimum voltage circuit 300 may further include a plurality of NMOS switches, in addition to the second NMOS switch (M4), where the plurality of NMOS switches may be configured to protect the PAD from stress caused by variation in the maximum signal (MAX) and a minimum signal (MIN).

In some embodiments, the third set of conditions that may allow the minimum signal to place the second NMOS switch (M4) into an off-state may include: (i) the PAD signal being at the first voltage level and the minimum signal at a drain of the second NMOS switch (M4) also being at the first voltage level (0V), and (ii) the PAD signal being at VDDQ and the minimum signal at a drain of the second NMOS switch (M4) being at a second percentage of VDDQ (0.33*VDDQ).

In some embodiments, the fourth set of conditions that may allow the minimum signal to place the second PMOS switch (M6) into an on-state may include: (i) the PAD signal being at 0V and the minimum signal at the drain of second PMOS switch (M6) also being at 0V, and (ii) the PAD signal being at VDDQ and the minimum signal at the drain of second PMOS switch (M6) being at 0.33*VDDQ.

In some embodiments, second NMOS switch (M4) in conjunction with the maximum voltage circuit 200 may be configured to pass a signal at 0V through second NMOS switch (M4) when the PAD signal and the minimum signal at the drain of second PMOS switch (M6) are both at 0V.

Figure 4:
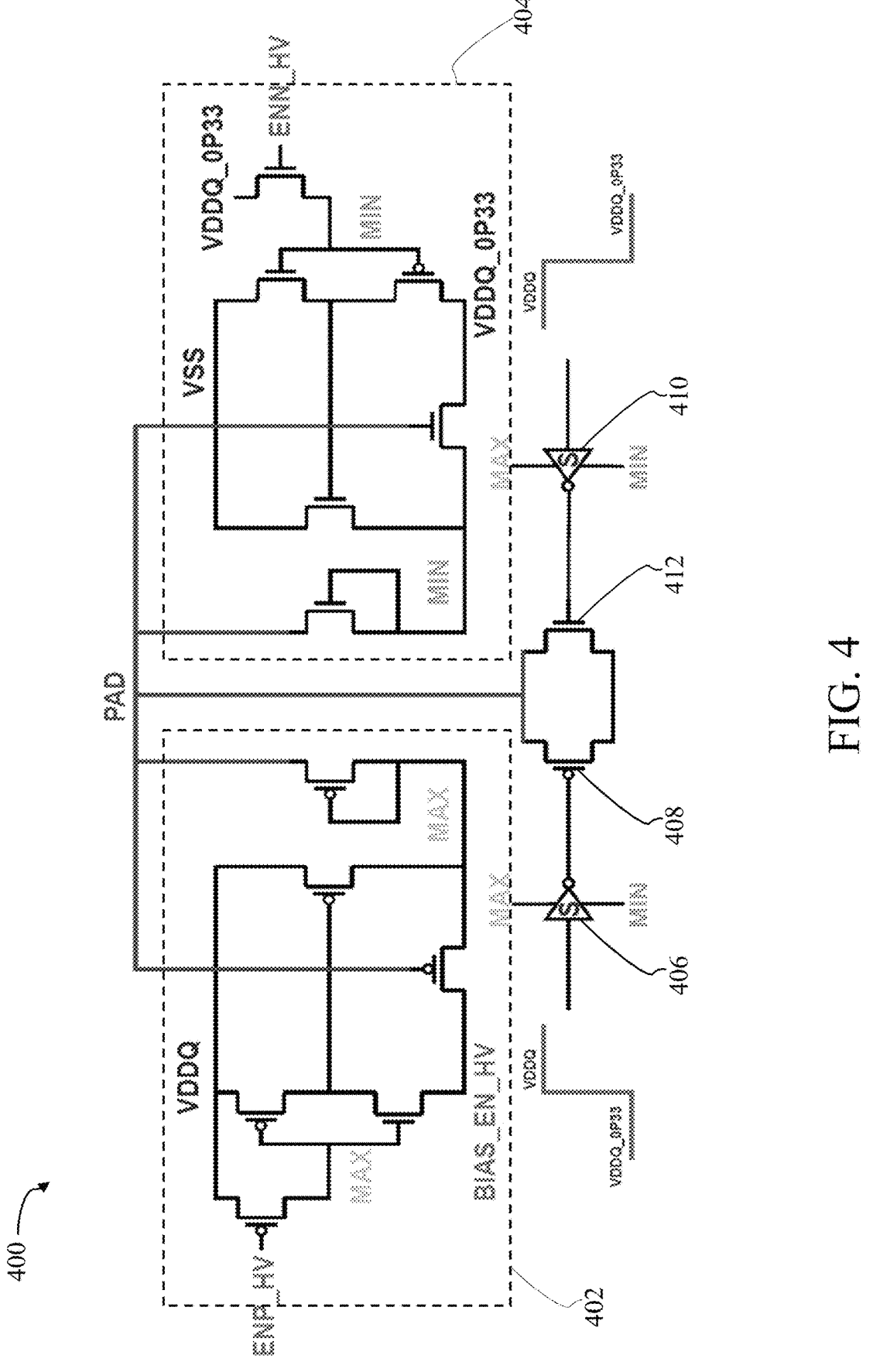
FIG. 4 is a diagram illustrating an example architecture for a dynamic switching circuit in accordance with the present disclosure.

Referring now to FIG. 4, a diagram illustrating an example architecture for dynamic switching circuit 400 is shown. Dynamic switching circuit 400 may include a PAD (not shown) which may be configured to receive a variable external signal (PAD signal). Dynamic switching circuit 400 may also include maximum voltage circuit 402 and minimum voltage circuit 404, such that both maximum voltage circuit 402 and minimum voltage circuit 404 are operatively connected to the PAD. Additionally, dynamic switching circuit 400 may also include first plurality of inverters 406 which may be operatively connected to the PAD via third PMOS switch 408 and second plurality of inverters 410 which may be operatively connected to the PAD via third NMOS switch 412, where first plurality of inverters 406 and second plurality of inverters 410 may both be configured to protect the PAD from stress caused by variation in the maximum signal and the minimum signal.

In some embodiments, dynamic switching circuit 400 may include an unterminated mode that may be configured to increase the maximum signal to be at VDDQ and to hold the minimum signal at or near 0V, when a control signal may be transmitted at a third percentage of VDDQ (0.5*VDDQ).

Maintaining the 0.5*VDDQ voltage level may ensure that dynamic switching circuit 400 experiences more desirable overdrive voltage levels, where the overdrive voltage is a measure of the voltage between a transistor's switch and source (Vas) in excess of the threshold voltage (VTH), and where VTH is the minimum voltage required between the transistor's switch and source that allows the transistor to remain in an on-state. Additionally, dynamic switching circuit 400 may include a terminated mode that may be configured to hold both the maximum signal (MAX) and the minimum signal (MIN) at or above 0.33*VDDQ, such that MAX(pad)=VDDQ, where 0.33*VDDQ<pad<VDDQ and MIN (pad)=0.33*VDDQ, where 0.33*VDDQ<pad<VDDQ. Further, the maximum signal and the minimum signal may be adjusted from dynamic to static voltage levels.

Figure 5:
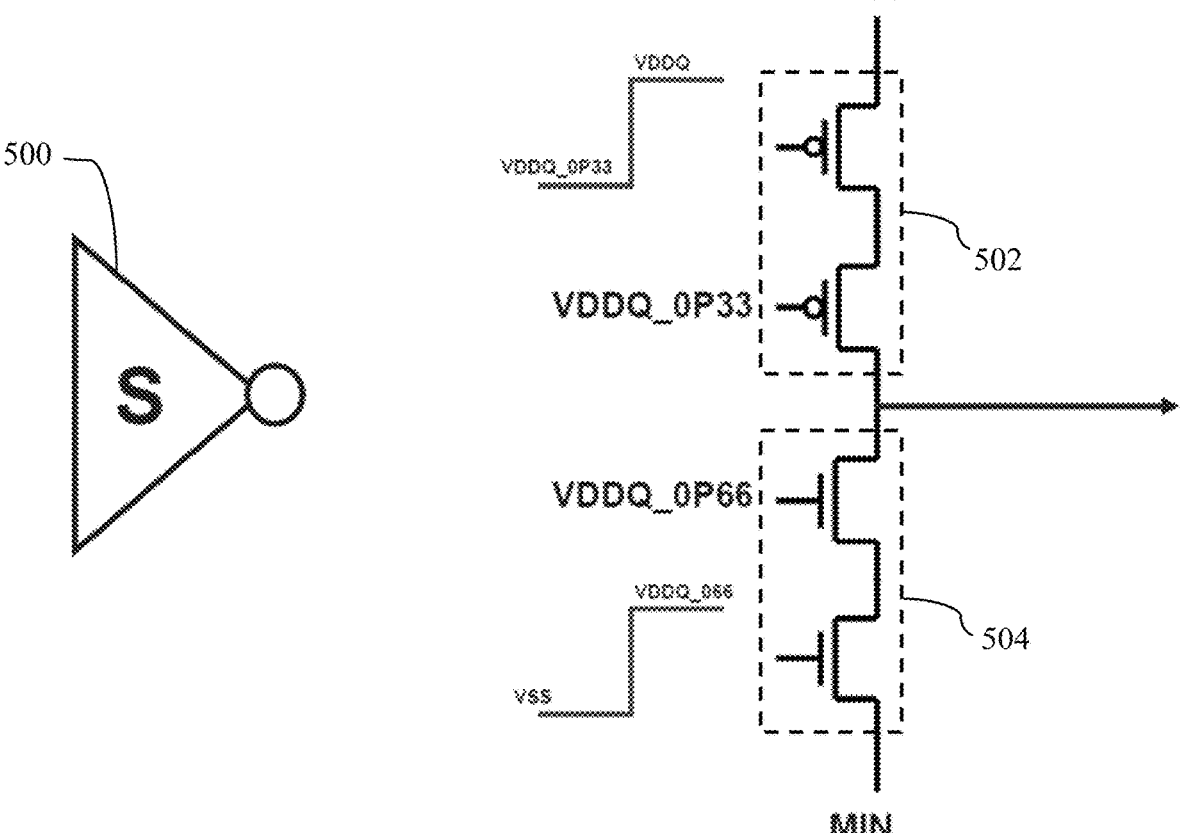
FIG. 5 is a diagram illustrating an example architecture for a stacked inverter circuit in accordance with the present disclosure.

Referring now to FIG. 5, a diagram illustrating an example architecture for stacked inverter circuit 500 is shown. Stacked inverter circuit 500 may include a plurality of PMOS switches 502 and a plurality of NMOS switches 504 connected in series such that a variable maximum voltage signal may be transmitted through the plurality of PMOS switches 502 to a PAD (not shown) and such that a variable minimum voltage signal through the plurality of NMOS switches 504 to the PAD.

Figure 6A:
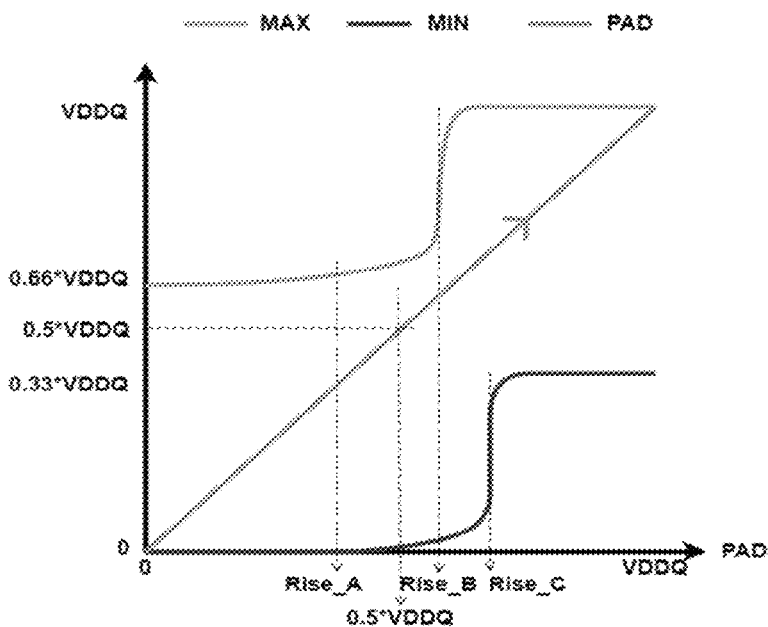
FIG. 6A is a graph illustrating example transfer characteristics associated with a rising signal edge.
Figure 6B:
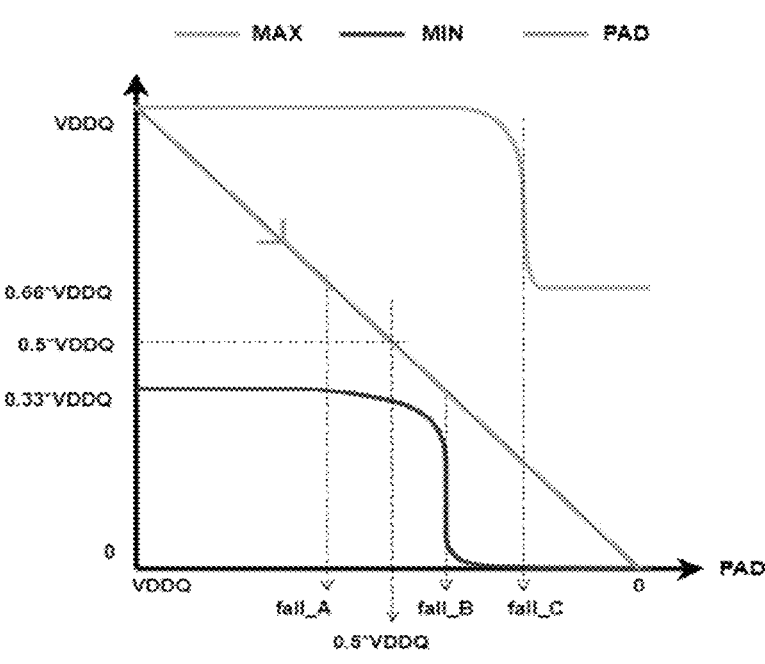
FIG. 6B is a graph illustrating example transfer characteristics associated with a falling signal edge.

Referring now to FIGS. 6A & 6B, graph 600 illustrating example transfer characteristics associated with a rising signal edge, and graph 602 illustrating example transfer characteristics associated with a falling signal edge. According to graph 600, upon encountering a rising signal edge: (i) the maximum signal (MAX) may reach VDDQ more quickly than the PAD signal may reach VDDQ, (ii) the maximum signal may reach the first percentage of VDDQ (0.66*VDDQ) when the PAD signal may be at the first voltage level (0V), and (iii) a difference between the maximum signal and the minimum signal (MIN) may be greater than 0.66*VDDQ, such that MAX−MIN>0.66*VDDQ, when the PAD signal may be at third percentage of VDDQ (0.5*VDDQ).

According to graph 602, upon encountering a falling signal edge: (i) the minimum signal may reach the first voltage level (0V) more quickly than the PAD signal may reach the first voltage level, (ii) the minimum signal may reach the second percentage of VDDQ (0.33*VDDQ) when the PAD signal is at VDDQ, and (iii) a difference between the maximum signal and the minimum signal may be greater than 0.66*VDDQ, such that MAX−MIN>0.66*VDDQ, when the PAD signal may be at 0.5*VDDQ.

Figure 7:
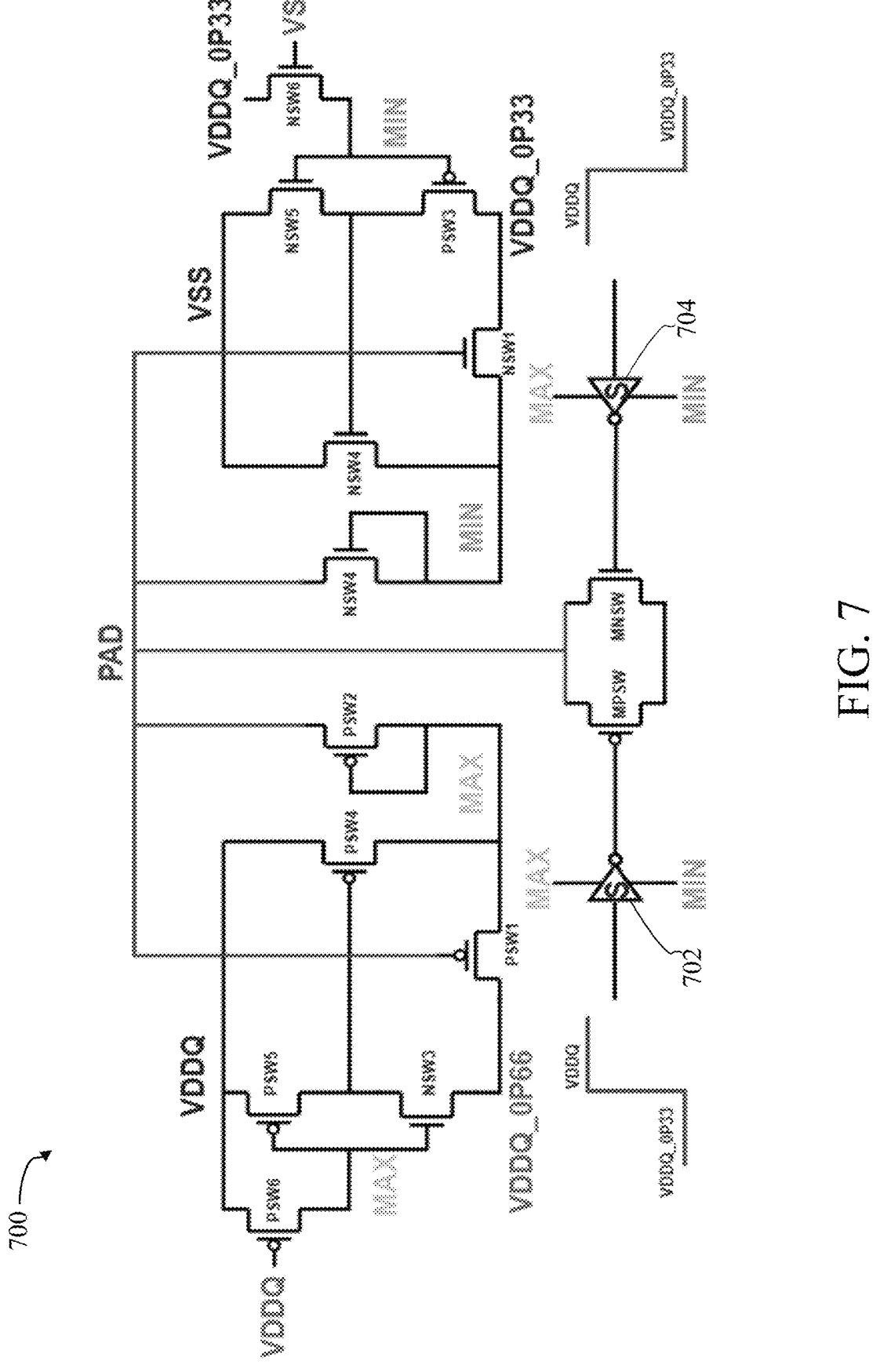
FIG. 7 is a diagram illustrating an example architecture for a dynamic switching circuit in an unterminated mode in accordance with the present disclosure.

Referring now to FIG. 7, a diagram illustrating an example architecture for dynamic switching circuit 700 is shown. As mentioned earlier, dynamic switching circuit 700 may include a terminated mode where signals may be prevented from reflecting off the end of the transmission line and an unterminated mode where reflections may occur off the end of the transmission line. However, in addition to being in terminated/unterminated modes dynamic switching circuit 700 may also be placed into on/off states, where the variable voltage levels of the PAD signal, the maximum voltage signal, and the minimum voltage signal may each behave very differently depending on which state (on/off) and which mode (terminated/unterminated) dynamic switching circuit 700 may be operating in.

In some embodiments dynamic switching circuit 700 may be in an unterminated mode while also being in an off-state. While in an unterminated off-state, placing a PAD signal at 0V may cause a first PMOS switch (PSW1) to set the maximum signal to 0.66*VDDQ. A main PMOS switch (MPSW) may be at 0.66*VDDQ and drain at 0V, which may cause MPSW to switch to an off-state and allow the stacked inverters 702, 704 to pass the maximum signal to MPSW. Additionally, while in an unterminated off-state, placing the PAD signal at $0.66*VDDQ-V_{th\_PSW1}$, where $V_{th\_PSW1}$ may be a threshold voltage for PSW1, may cause PSW1 to switch into an off-state and a second PMOS switch (PSW2) to switch to an on-state when the PAD signal may reach $0.66*VDDQ+MAX$ ($V_{th\_PSW2}$) where $V_{th\_PSW2}$ may be a threshold voltage for PSW2, which may trigger a third NMOS switch (NSW3) and set the maximum signal to VDDQ through a fourth PMOS switch (PSW4). The maximum signal may reach VDDQ before the PAD signal may reach VDDQ, which may cause MPSW to switch off completely from 0V to VDDQ. In this transition, none of the devices may be stressed. Further, if initially the minimum signal may be at 0V when the PAD signal may be at 0V, then the main NMOS switch (MNSW) switch may also be at 0V and drain at 0V, which may cause MNSW to switch to an off-state. Stacked inverters 702, 704 may then pass the minimum signal to MNSW. Moreover, when the PAD signal may be at $0.33*VDDQ+V_{th\_NSW1}$, where $V_{th\_NSW1}$ may be a threshold voltage for a first NMOS switch (NSW1), NSW1 may be in an on-state and the minimum signal may reach $0.33*VDDQ$ and remain there until the PAD signal may reach VDDQ. Then once the minimum signal may be $0.33*VDDQ$ and the PAD signal may be VDDQ, MNSW may switch off completely from 0V to VDDQ. Again, in this transition, none of the devices may be stressed. As such, whether the PAD signal may rise from 0V to VDDQ, or may fall from VDDQ to 0V, the same transitions may occur.

In some embodiments dynamic switching circuit 700 may be in an unterminated mode while also being in an on-state. While in an unterminated on-state, placing the PAD signal at 0V may cause PSW1 to reset the maximum signal to $0.66*VDDQ$, while the gate of MNSW may be at $0.66*VDDQ$ and drain at 0V. This may cause MNSW to switch to an on-state. Stacked inverters 702, 704 may then pass the maximum signal to MNSW, such that a logic 0 signal may also pass through MNSW. Additionally, when the PAD signal may be at $0.66*VDDQ-V_{th\_PSW1}$, PSW1 may be in an off-state and PSW2 may switch to an on-state when the PAD signal reaches $0.66*VDDQ+max$ ($V_{th\_PSW2}$, threshold voltage for PSW2). This may trigger the NSW3 and may cause the maximum signal at VDDQ to pass through PSW4. The maximum signal may reach VDDQ before the PAD signal may reach VDDQ, this may cause MNSW to switch off completely at VDDQ and this "logical high" signal may be passed through MPSW. Further, if the minimum signal may be at 0V when the PAD signal is also at 0V, then the MPSW switch may be at 0V and drain at 0V, such that MPSW switches to an off-state at 0V. Stacked inverters 702, 704 may then be used to pass the minimum signal to MPSW. Moreover, when the PAD signal may be at $0.33*VDDQ+V_{th\_NSW1}$, NSW1 may be in an on-state and the minimum signal may reach $0.33*VDDQ$ and remain there until the PAD signal may reach VDDQ. When the minimum signal may be at $0.33*VDDQ$ and the PAD signal may reach VDDQ, MPSW may switch on completely at VDDQ levels. As such, whether the PAD signal may rise from 0V to VDDQ, or may fall from VDDQ to 0V, the same transitions may occur. Additionally, MNSW may be able to pass the logic low levels, and MPSW may be able to pass the logic high levels. While dynamic switching circuit 700 may be in an unterminated on-state, and a PAD signal may be rising to $0.5*VDDQ$, the maximum signal may rapidly approach VDDQ and the minimum signal may slowly approach $0.33*VDDQ$, there may be enough overdrive voltage for both MNSW and MPSW to pass $0.5*VDDQ$ levels. Similarly, when the PAD signal may fall to $0.5*VDDQ$, the maximum signal may be slowly approaching $0.66*VDDQ$ and the minimum signal may be rapidly approaching 0V, and there may be enough overdrive voltage for both MPSW and MNSW to pass $0.5*VDDQ$ levels.

In some embodiments dynamic switching circuit 700 may be in a terminated mode while also being in an on/off state. While in a terminated on/off-state the PAD signal low logic level may be $0.33*VDDQ$, and the VDDQ and $0.33*VDDQ$ levels may be used to switch MPSW/MNSW switches into either on/off states. To work in terminated mode, a gate of sixth PMOS (PSW6) may be set to $0.33*VDDQ$, a gate of sixth NMOS switch (NSW6) may be set to VDDQ and a node between NSW3 and PSW1 may be set to VDDQ. This configuration may fix the maximum signal to always be at VDDQ and fix the minimum signal to always be at $0.33*VDDQ$. Stacked inverters 702, 704, may be used to pass the maximum signal to MPSW and the minimum signal to MNSW in order to block the PAD signal. Further, to pass the PAD signal, the maximum signal may be passed to MNSW and the minimum signal may be passed to MPSW.

In some embodiments, dynamic switching circuit 700 may not require any thick oxide devices to pass signals higher than the voltage range specified by a process node. The overall impedance (Ron) may remain flat across, rail to rail from 0V to VDDQ. Dynamic switching circuit 700 may not include any stacked switches for protection, and hence may not be required to use larger devices to lower Ron. When compared to a 3 stack of switches, the size of dynamic switching circuit 700 may be three times smaller, the bandwidth of dynamic switching circuit 700 may be three times higher, and the current required to match the same bandwidth in the amplifier will be three times smaller. The static current passing through the maximum circuit and the minimum circuit may be at 0V, such that there is no excess power consumption. Thin oxide devices may be reliably safe across all modes of operation, whether dynamic switching circuit 700 be in a terminated on/off mode where the signals vary from $0.33VDDQ-VDDQ$, or in an unterminated mode from rail to rail. Further, autozero architectures may be implemented in lower process nodes where thick oxide devices are not present.

It will be apparent to those skilled in the art that various modifications and variations can be made to the embodiments of the present disclosure as described without departing from the spirit or scope of the invention. Thus, it is intended that embodiments of the present disclosure cover the modifications and variations of this invention provided they come within the scope of the appended claims and their equivalents.

What is claimed is:
1. A dynamic switching circuit comprising:
an interface configured to receive a variable external signal;
a maximum voltage circuit operatively connected to the interface, the maximum voltage circuit including a first positive channel metal oxide semiconductor (PMOS) switch and a first negative channel metal oxide semiconductor (NMOS) switch, wherein the maximum voltage circuit provides a maximum signal configured to place the first PMOS switch into an off-state when at least one condition from a first set of conditions is satisfied and to place the first NMOS switch into an on-state when at least one condition from a second set of conditions is satisfied a minimum voltage circuit operatively connected to the interface, the minimum voltage circuit including a second PMOS switch, and a second NMOS switch, wherein the minimum voltage circuit provides a minimum signal configured to place the second NMOS switch into an off-state when at least one condition from a third set of conditions is satisfied, and to place the second PMOS switch into an on-state when at least one condition from a fourth set of conditions is satisfied; and wherein the external signal, the maximum signal, and the minimum signal are configured to vary between a first voltage level, an output drain power voltage (VDDQ), a first percentage of VDDQ, a second percentage of VDDQ, and a third percentage of VDDQ.

2. The dynamic switching circuit of claim 1, wherein the first set of conditions that allow the maximum signal to place the first PMOS switch into an off-state include:

(i) the external signal being at the first percentage of VDDQ and the maximum signal at a drain of the first PMOS switch being at the first percentage of VDDQ, and (ii) the external signal being at VDDQ and the maximum signal at the drain of the first PMOS switch also being at VDDQ.

3. The dynamic switching circuit of claim 1, wherein the second set of conditions that allow the maximum signal to place the first NMOS switch into an on-state include:

(i) the external signal being at the first voltage level and the maximum signal at a source of the first NMOS switch being at the first percentage of VDDQ, and (ii) the external signal being at VDDQ, and the maximum signal at the source of the first NMOS switch also being at VDDQ.

4. The dynamic switching circuit of claim 3, wherein the first PMOS switch in conjunction with the minimum voltage circuit are configured to pass the maximum signal through the first NMOS switch when the external signal and the maximum signal at the first NMOS switch are both at VDDQ.

5. The dynamic switching circuit of claim 1, wherein the third set of conditions that allow the minimum signal to place the second NMOS switch into an off-state include:

(i) the external signal being at the first voltage level and the minimum signal at a drain of the second NMOS switch also being at the first voltage level, and (ii) the external signal being at VDDQ and the minimum signal at the drain of the second NMOS switch being at the second percentage of VDDQ.

6. The dynamic switching circuit of claim 1, wherein the fourth set of conditions that allow the minimum signal to place the second PMOS switch into an on-state include:

(i) the external signal being at the first voltage level and the minimum signal at a drain of the second PMOS switch also being at the first voltage level, and (ii) the external signal being at VDDQ and the minimum signal at the drain of the second PMOS switch being at the second percentage of VDDQ.

7. The dynamic switching circuit of claim 6, wherein the second NMOS switch in conjunction with the maximum voltage circuit are configured to pass a signal at the first voltage level through the drain of the second NMOS switch when the external signal and the minimum signal at the drain of the second PMOS switch are both at the first voltage level.

8. The dynamic switching circuit of claim 1, wherein the dynamic switching circuit includes an unterminated mode configured to increase the maximum signal to be at VDDQ and to hold the minimum signal at or near the first voltage level when a control signal is transmitted at the third percentage of VDDQ.

9. The dynamic switching circuit of claim 1, wherein the dynamic switching circuit includes a terminated mode configured to hold the maximum signal at or above VDDQ and to hold the minimum signal at or above the second percentage of VDDQ.

10. The dynamic switching circuit of claim 1, wherein on a rising signal edge:

(i) the maximum signal reaches VDDQ more quickly than the external signal reaches VDDQ, (ii) the maximum signal reaches the first percentage of VDDQ when the external signal is at the first voltage level, and (iii) a difference between the maximum signal (MAX) and the minimum signal (MIN) is greater than the first percentage (%) of VDDQ, such that MAX–MIN>%*VDDQ, when the external signal is at the third percentage of VDDQ.

11. The dynamic switching circuit of claim 1, wherein on a falling signal edge:

(i) the minimum signal reaches the first voltage level more quickly than the external signal reaches the first voltage level, (ii) the minimum signal reaches the second percentage of VDDQ when the external signal is at VDDQ, and (iii) a difference between the maximum signal (MAX) and the minimum signal (MIN) is greater than the first percentage (%) of VDDQ, such that MAX–MIN>%*VDDQ, when the external signal is at the third percentage of VDDQ.

12. The dynamic switching circuit of claim 1, wherein a static current passing through the maximum circuit and the minimum circuit is at the first voltage level, such that there is no excess power consumption.

13. A system for dynamic switching, the system comprising:

a dynamic switching circuit comprising:

an interface configured to provide a variable external signal;

a maximum voltage circuit operatively connected to the interface, the maximum voltage circuit including a first PMOS switch and a first NMOS switch, wherein the maximum voltage circuit provides a maximum signal that is configured to place the first PMOS switch into an off-state when at least one condition from a first set of conditions is satisfied and to place the first NMOS switch into an on-state when at least one condition from a second set of conditions is satisfied; and a minimum voltage circuit operatively connected to the interface, the minimum voltage circuit including a second PMOS switch and a second NMOS switch, wherein the minimum voltage circuit provides a minimum signal that is configured to place the second NMOS switch into an off-state when at least one condition from a third set of conditions is satisfied and to place the second PMOS switch into an on-state when at least one condition from a fourth set of conditions is satisfied, wherein the external signal, the maximum signal, and the minimum signal are configured to vary between a first voltage level, an output drain power voltage (VDDQ), a first percentage of VDDQ, a second percentage of VDDQ, and a third percentage of VDDQ.

14. The system of claim 13, wherein a first plurality of inverters is operatively connected to the interface via a third PMOS switch and a second plurality of inverters is operatively connected to the interface via a third NMOS switch, and wherein the first plurality of inverters and the second plurality of inverters are both configured to protect external devices connected to the interface from stress caused by variation in the maximum signal and the minimum signal.

15. The system of claim 13, wherein the maximum voltage circuit further includes a plurality of PMOS switches, in addition to the first PMOS switch, and wherein the minimum voltage circuit further includes a plurality of NMOS switches, in addition to the second NMOS switch.

16. The system of claim 13, wherein on a rising signal edge:

(i) the maximum signal reaches VDDQ more quickly than the external signal reaches VDDQ, (ii) the maximum signal reaches the first percentage of VDDQ when the external signal is at the first voltage level, and (iii) a difference between the maximum signal (MAX) and the minimum signal (MIN) is greater than the first percentage (%) of VDDQ, such that MAX−MIN>%*VDDQ, when the external signal is at the third percentage of VDDQ.

14

17. The system of claim 13, wherein on a falling signal edge:

(i) the minimum signal reaches the first voltage level more quickly than the external signal reaches the first voltage level, (ii) the minimum signal reaches the second percentage of VDDQ when the external signal is at VDDQ, and (iii) a difference between the maximum signal (MAX) and the minimum signal (MIN) is greater than the first percentage (%) of VDDQ, such that MAX−MIN>%*VDDQ, when the external signal is at the third percentage of VDDQ.

18. The system of claim 13, wherein the dynamic switching circuit includes an unterminated mode configured to increase the maximum signal to be at VDDQ and to hold the minimum signal at or near the first voltage level when a control signal is transmitted at the third percentage of VDDQ.

19. The system of claim 13, wherein the dynamic switching circuit includes a terminated mode configured to hold the maximum signal at or above VDDQ and to hold the minimum signal at or above the second percentage of VDDQ.

* * * * *